United States Patent [19]

Takeoka et al.

[11] Patent Number: 4,756,811
[45] Date of Patent: Jul. 12, 1988

[54] METHOD FOR MANUFACTURING BUBBLE-MODE OPTICAL RECORDING MEDIA

[75] Inventors: Yoshikatsu Takeoka, Kawasaki; Nobuaki Yasuda, Zushi; Norio Ozawa, Kawasaki, all of Japan

[73] Assignee: Kabushiki Kaisha Toshiba, Kawasaki, Japan

[21] Appl. No.: 913,752

[22] Filed: Sep. 30, 1986

[30] Foreign Application Priority Data

Sep. 30, 1985 [JP] Japan .............................. 60-214520
Sep. 30, 1985 [JP] Japan .............................. 60-214521

[51] Int. Cl.$^4$ .............................................. C23C 14/34
[52] U.S. Cl. ........................... 204/192.26; 204/192.15; 430/270
[58] Field of Search ...................... 204/192.14, 192.15, 204/192.26, 192.27, 192.28; 430/270, 945, 964; 346/135.1

[56] References Cited

U.S. PATENT DOCUMENTS

| | | | |
|---|---|---|---|
| 4,499,178 | 2/1985 | Wada et al. ...................... | 430/945 X |
| 4,565,772 | 1/1986 | Takeoka et al. ................. | 430/945 X |
| 4,579,807 | 4/1986 | Blonder et al. ................. | 430/270 X |
| 4,647,947 | 3/1987 | Takeoka et al. ................. | 430/945 X |

Primary Examiner—John F. Niebling
Assistant Examiner—Nam X. Nguyen
Attorney, Agent, or Firm—Oblon, Fisher, Spivak, McClelland & Maier

[57] ABSTRACT

There is disclosed a method for manufacturing a bubble-mode optical disk having a recording layer made of a mixture of an indium oxide matrix containing indium clusters and organic clusters. The indium clusters absorb an energy of incident laser beam to heat the organic clusters which then release a gas component such that the matrix is locally deformed to form a protuberance. A plasma sputtering is used to deposit the recording layer on a disk substrate placed in a sputtering chamber. A target body used is made of indium. A low-pressure gaseous atmosphere in the chamber includes a methane series hydrocarbon gas and an oxygen gas. The gaseous atmosphere may include a hydrogen gas or a nitrogen gas.

11 Claims, 5 Drawing Sheets

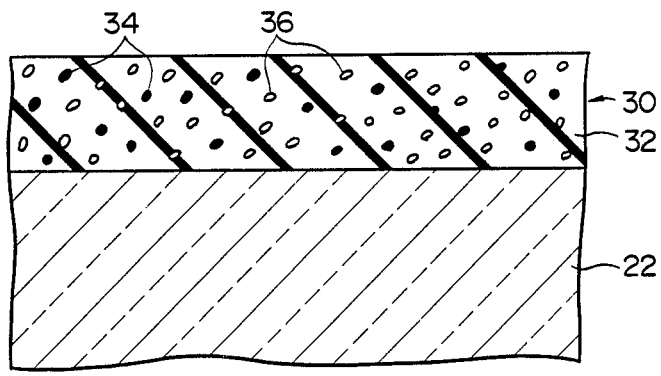
FIG. 2
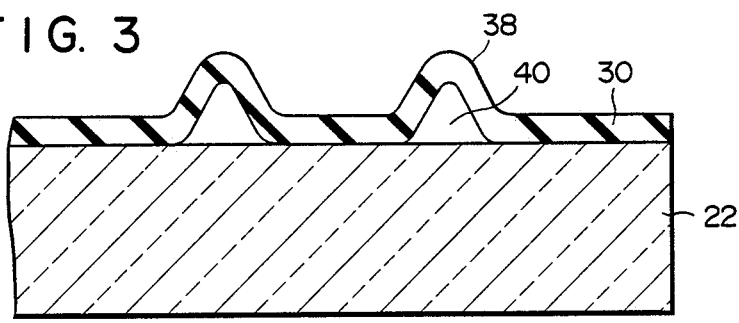
FIG. 3
FIG. 4
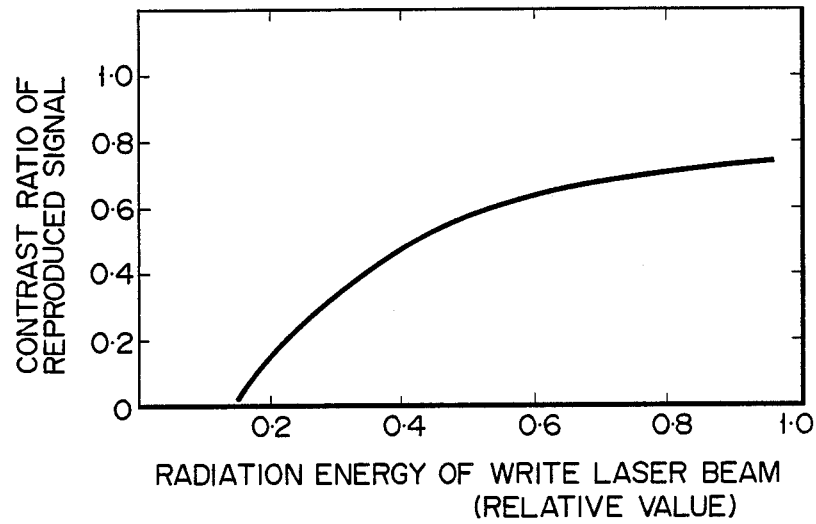

METHOD FOR MANUFACTURING BUBBLE-MODE OPTICAL RECORDING MEDIA

BACKGROUND OF THE INVENTION

The present invention relates to optical recording media and, in particular, to a manufacturing method for a disk-shaped optical recording medium having a recording layer which forms thereon local projections in response to radiation of laser beam.

Recently, considerable effort has been given to the development of optical recording media. Such recording media offer an advantage over other kinds of recording media in that they can store data information at high recording density to provide very large storage capacities.

There is known among those skilled in the art an optical disk having a recording layer made of an organic matrix which contains metallic clusters. When a write laser beam is radiated onto the recording layer, the metallic clusters absorb beam energy, and the matrix emits a gas contained therein to thereby form protuberances on the surface of the recording layer, whereby optical data may be stored in the optical disk.

The structure of the recording layer is simplified to improve the utilization efficiency of the laser beam. However, it is very difficult to properly control the relationship between the energy intensity of the laser beam and the amount of gas released from the organic matrix, thereby decreasing productivity of such optical disks. For example, when the energy intensity of the write beam is too high, the recording layer immediately bursts. Alternatively, when the beam intensity is too low, the production of gas from the matrix layer is insufficient to result in proper projection of the recording layer. An optimal (allowable) range of the beam intensity is thus narrowed. The amount of gas released from the recording layer also depends upon the ratio of the organic matrix to the metallic clusters. Accordingly, it is difficult to determine an optimal beam intensity. In order to perform proper data recording, a strict relationship between the ratio of the organic matrix to the metallic clusters in the recording layer and the laser beam intensity must be established. When the manufacturing process control is restricted to obtain the required ratio, the yield of the disks may be limited, i.e., productivity may be lowered, resulting in high cost. The drawback of the conventional optical disk of the above kind is due to insufficient thermal stability of the organic matrix.

There has been proposed in U.S. patent application Ser. No. 778,245 an improved optical disk free from the aforementioned drawbacks. This optical disk has a specific recording layer made of a refractory base layer in which metal clusters and organic clusters are uniformly contained. When a write laser beam modulated to represent data information is incident on the recording layer, the metal clusters absorb beam energy, the organic clusters produce a gas component, thereby causing the base layer to incur a local projection by a pressure of the gas component such that protuberances are formed on the recording layer.

In the above-identified Application for Patent, to manufacture the optical disk of the above structure, sputtering technique is used to form such recording layer on a substrate. According to this manufacturing method, however, a complexed target body having a backing plate on which pellets are provided. Since the number of pellets should be determined in accordance with desired contents of metal and organic clusters, different target bodies must be prepared to manufacture optical disks of different mixture ratios of such clusters. This may be a bar for optical disk manufactures to improve the productivity of optical disks.

SUMMARY OF THE INVENTION

It is therefore an object of the present invention to provide a new and improved method for manufacturing optical recording media enabling stable data recording.

In accordance with the above object, the present invention is addressed to a specific method for manufacturing a bubble-mode optical recording medium having a substrate on which a recording layer is formed. The recording layer is comprised of a mixture of a heat resistant (refractory) matrix containing metal clusters and organic clusters. The metal clusters absorb an energy of beam radiation which is incident onto the recording layer. The metal clusters heat the organic clusters which then generate or release a gas component such that the matrix is locally deformed to form a protuberance.

According to the manufacturing method of the invention, the substrate is placed in a chamber to substantially oppose a target body, which is substantially made of low-melting point metal for constituting the metal clusters contained in the matrix of the refractory layer. A low-pressure gaseous atmosphere including a methane series hydrocarbon gas and an oxygen is formed in the chamber in which the substrate and the target body are placed. Plasma sputtering is performed by generating a plasma between the substrate and the target body in a mixture of methane and oxygen, whereby the recording layer is deposited on the substrate of the optical recording medium.

The invention, and its objects and advantages, will become more apparent in the detailed description of a preferred embodiment presented below.

BRIEF DESCRIPTION OF THE DRAWINGS

In the detailed description of a preferred embodiment of the invention presented below, reference is made to the accompanying drawings, in which:

FIG. 2 is a sectional view of the main part of an optical disk which has a recording layer formed on a substrate using the manufacturing method of the invention;

FIG. 3 is a sectional view of the optical disk wherein the recording layer incurs local projections upon radiation of a write laser beam to form protuberances thereon (not drawn to scale); and FIGS. 4 to 10 are graphs showing some recording/reproduction characteristics of optical disks manufactured using the method of the invention.

DETAILED DESCRIPTION OF THE PREFERRED EMBODIMENT

Figure 1:
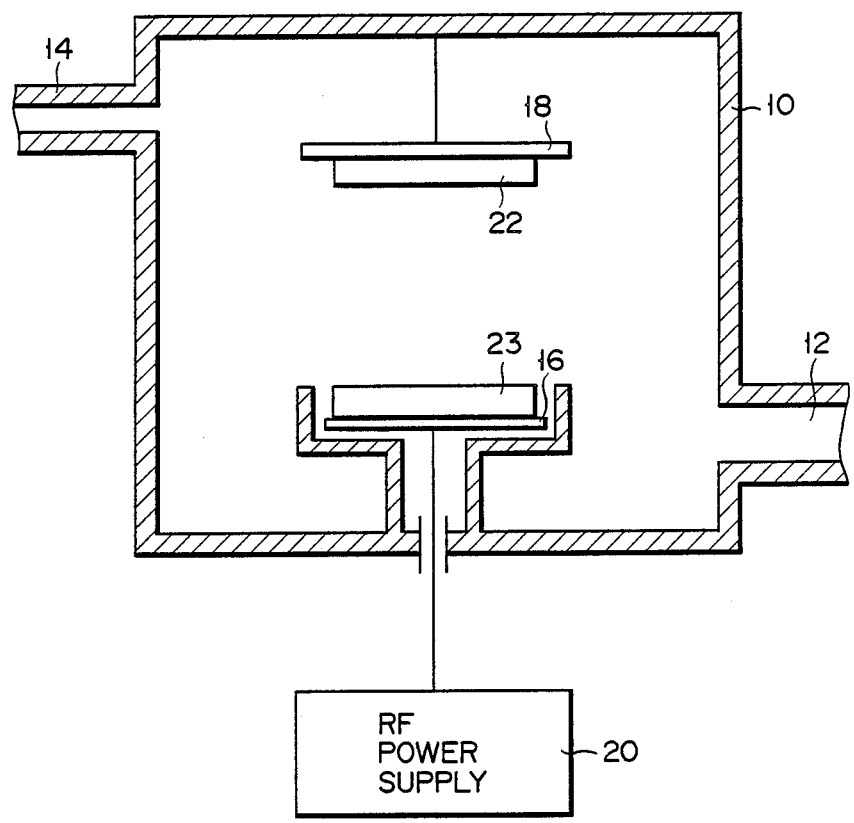
FIG. 1 is a schematic diagram showing sectional view of a plasma sputtering apparatus used to manufacture an optical disk in accordance with one embodiment of the invention.

Referring now to FIG. 1 there is shown a plasma sputtering apparatus used to manufacture a bubble-mode optical disk having a recording layer comprised of a mixture of a heat-resistant (refractory) material, metal clusters serving to absorb the energy of write laser beam, and organic clusters for releasing gas component. A chamber 10 is evacuated by a known vacuum pump (not shown) through an outlet port 12, and is thus kept in a vacuum. A gas inlet 14 is formed in chamber 10. Two electrodes 16 and 18 oppose each other in the inner space of chamber 10. Electrode 16 serves as a target electrode to which RF power is fed by an RF power supply 20. Electrode 18 serves as an electrode for placing a disk-shaped substrate 22 on which a recording layer is to be formed.

Disk-shaped substrate 22 may be a transparent substrate consisting of an organic resin such as polycarbonate, polymethyl methacrylate, epoxy, or the like. When the recording layer of an optical disk is formed on substrate 22, a target body 23 of a low-melting point metal such as indium is connected to electrode 16. The low-melting point metal has a high affinity with oxygen or a low practical nobility and is used to constitute the metal clusters contained in the refractory matrix of the recording layer. The air inside vacuum chamber 10 is exhausted through outlet port 12 so as to set the interior of chamber 10 at a vacuum of about $10^{-6}$ Torr. Then, a sputtering gas containing a plurality of gases as materials for constituting the matrix (insulative base) and the organic clusters of the recording layer of the optical disk are introduced into chamber 10 through gas inlet 14 until the gas pressure therein reaches $5 \times 10^{-3}$ Torr. In this embodiment, a gas mixture of methane series hydrocarbon (e.g., methane ($CH_4$)), oxygen ($O_2$) and hydrogen ($H_2$) is introduced into chamber 10 until the gas pressure therein reaches $5 \times 10^{-3}$ Torr. It should be noted that when methane is selected as methane series hydrocarbon, the volume ratio ($CH_4/O_2$) of the methane gas to oxygen gas ($O_2$) is set to fall within a range of 95/5 to 50/50, and the volume ratio (($CH_4 + O_2$)/$H_2$) of the sum of the methane gas and oxygen to hydrogen ($H_2$) is set to fall within a range of 90/10 to 50/50.

While substrate 22 is constantly rotated within chamber 10, RF power (e.g., 13.56 MHz) is supplied to indium target 23 by RF power supply 20 via target electrode 16 to produce a plasma within chamber 10. Plasma sputtering is started in this manner and a recording layer is deposited on rotating substrate 22. The recording layer consists of a target body material of a single type low-melting point metal (indium, in this embodiment) and the elements (C, H, O) constituting the plurality of gas components introduced from port 14. As will be apparent from many experimental data to be described below in detail, although a gas such as acetylene ($C_2H_2$), ethane ($C_2H_6$), and propane ($C_3H_8$) can be used, other than methane, as the methane series hydrocarbon in the gas mixture for plasma sputtering, methane was most preferable in view of increase in deposition rate on the substrate of the recording layer.

FIG. 2 is a schematic sectional view of an optical disk obtained by plasma sputtering described above. Recording layer 30 deposited on transparent substrate 22 consists of a mixture of indium oxide ($In_2O_3$) matrix 32, indium clusters 34 uniformly dispersed in matrix 32, and organic clusters 36 uniformly dispersed in matrix 32. Organic clusters 36 were prepared by plasma polymerization process during the sputtering. Referring to FIG. 2, metal clusters 34 and organic clusters 36 contained in matrix 32 are illustrated as black and white circles, respectively, for easy visual understanding. Matrix 32 is made of a non-volatile low-melting point metal oxide (refractory material) having high vaporization temperature. Note that the cluster size of clusters 34 and 36 is as small as 5 to 20 nanometers. This is because the materials constituting clusters 34 and 36 are supplied as gas components during plasma sputtering.

When data is stored into such bubble-mode optical disk, a write laser beam (not shown) is irradiated onto recording layer 30. The laser beam is modulated by a known pulse modulation technique so as to represent desired data information. Metal clusters 34 contained in matrix 32 thus absorb the beam energy by optical absorption such that the metal clusters are heated by absorption of the laser beam energy. Organic clusters 36 adjacent to the heated metal clusters in matrix 32 are also heated. These organic clusters 36 are evaporated to release or produce a gas component. Matrix 32 is thus deformed and projects locally by the pressure of the gas releasement to form a protuberance 38 (to be referred as a "bubble") on the upper surface of recording layer 30, as shown in FIG. 3. This protuberance is measured to be about 2,000 nanometers in width and 100 nanometers in height, although the height of protuberance 38 is emphasized in the illustration of FIG. 3. The portion represented by reference numeral 40 in FIG. 3 is a cavity formed by local upward pushing of recording layer 30 by the gas pressure, and partial peeling thereof from substrate 22. Data information can be stored or recorded by the local projection of recording layer 30.

After data information is stored in the bubble-mode optical disk of the invention in the manner described above, data reproduction (i.e., data readout) is carried out by using a read laser beam. The laser power (or laser intensity) of the read beam is about 1/5 to 1/10 of the write beam. When the read laser beam irradiates to form a spot on the bubble 38 of recording layer 30, the intensity of light reflected by (or transmitted through) bubble 38 differs from that reflected by a flat surface portion of the recording layer. The difference between the intensities of laser lights reflected by (or transmitted through) the bubble and the flat surface portion is detected by a known photodetector (not shown), such that original information represented by bubble 38 can be reproduced.

More specifically, in the region of recording layer 30 which has bubble 38, the radiated read beam is diffracted in accordance with the shape of bubble 38. The intensity of laser light reflected by bubble 38 differs greatly from that reflected by a nondeformed surface portion, that is, the flat portion of recording layer 32. The difference is detected and a reproduction output corresponding to the presence/absence of bubble 38 is extracted. A reproduction signal having a high carrier-to-noise ratio (known as a CNR to those skilled in the art) can be obtained.

FIG. 4 is a graph of a relationship between the radiation energy of a laser beam when data is written in the bubble-mode optical disk obtained in accordance with the above manufacturing method of the present invention by radiation of the recording laser beam, and the contrast ratio of a reproduced signal obtained from the bubble region (i.e., the region corresponding to protuberance 38 formed by laser radiation) and the flat region of the recording layer. In this graph, the radiation energy of the laser beam is defined by a relative value. The contrast ratio is defined as $(I_o - I_1)/(I_o + I_1)$ where $I_o$ is the level of a reproduced signal obtained from the flat surface portion of the recording layer and $I_f$ is the level of a reproduced signal obtained from the bubble region of the recording layer.

As is apparent from the graph of FIG. 4, when the relative value of the recording beam is comparatively small, the contrast ratio of the reproduced signal is small. This is because the local projection of matrix is small since the gas amount discharged from organic clusters 36 contained in recording layer 30 is small. The characteristic curve of FIG. 4 indicates that the projection amount of the bubble of layer 30 (i.e., the height of protuberance 38) can be continuously changed by changing the radiation energy of the laser beam.

Several examples of the manufacturing process will be described wherein a bubble-mode optical disk having the above-mentioned structure was manufactured in accordance with a basic principle of the present invention.

EXAMPLE 1

A recording film was formed using a sputtering unit having an In target of 8-inch diameter. A 1.5 mm-thick polymethyl methacrylate substrate was used as the substrate. The sputtering gas was a gas mixture of methane, oxygen, and hydrogen mixed at volume ratios of $CH_4/O_2=70/30$ and $(CH_4+O_2)/H_2=60/40$. The gas flow rates of $CH_4$, $O_2$, and $H_2$ were 21 cc/min, 9 cc/min, and 20 cc/min, respectively. Sputtering was performed by discharge at a pressure of $5\times10^{-3}$ Torr and a power of 300 W (13.56 MHz) for about 6 minutes, thereby depositing a recording film having a thickness of 70 nm on substrate 22.

Subsequently, the thus-obtained data recording medium was rotated at a frequency of 600 rpm. Recording was performed by irradiating the surface of substrate 22 with a GaAlAs laser beam, as a recording laser beam, which was focused to have a spot size of 1.5 μm and having an output of 10 mW and a pulse width of 100 nsec. Then, a continuous laser beam having an output of 0.5 mW was emitted as a reproducing laser beam, and reflected light was detected to perform reproduction. A reproduced output signal had a good CNR of 53 dB.

When the surface of the recorded spot was observed by a scanning electron microscope, bubbles of good shapes with a smooth surface each having bottom diameter of about 2 μm were formed in the spots irradiated with the recording laser beam. The recorded medium was kept under the condition of 70% RH for 20 days to test the environmental stability. Then, the surface of the recording film of the medium was observed by the scanning electron microscope. No striking change was found either in the bubbles or in the non-irradiated flat region. It was thus confirmed that the data recording medium manufactured in accordance with the present invention stably maintained good characteristics over a long period of time.

EXAMPLE 2

Following the same procedures as in Example 1, except for the gas mixture ratio, data recording media having recording films were manufactured. The gas mixture ratio of $CH_4/O_2$ was constantly 70/30, and that of $(CH_4+O_2)/H_2$ was set at seven values, i.e., 100/0, 91/9, 86/14, 75/25, 60/40, 50/50, and 46/54. The gas flow rates of $CH_4$ and $O_2$ were 21 cc/min, 9 cc/min, and that of $H_2$ was 3.5, 10, 20, and 35 cc/min, respectively. The film thicknesses were set at 70 nm by changing the discharge times.

Figure 5:
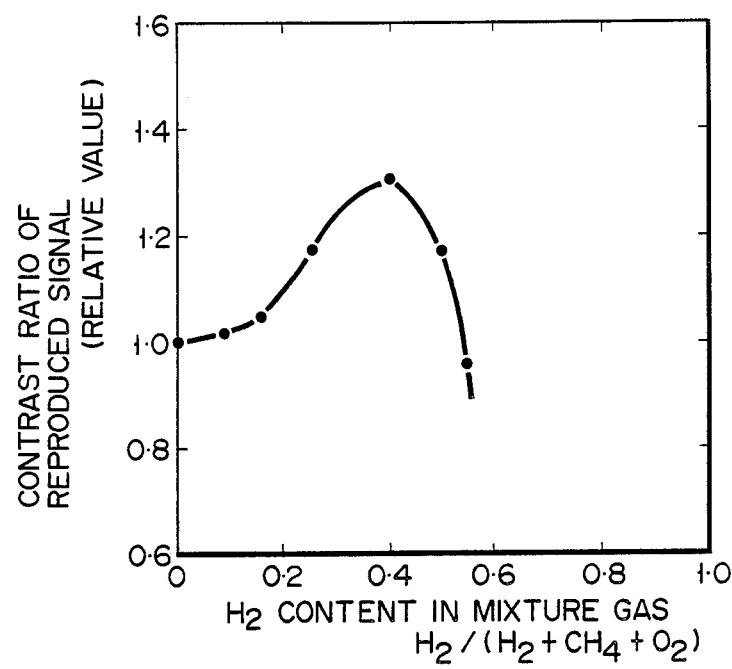

Subsequently, each data recording medium thus obtained was rotated at a frequency of 600 rpm. Recording was performed by irradiating the surface of the substrate with a GaAlAs laser beam, as a recording laser beam, which was focused to have a spot size of 1.5 μm, an output of 10 mW, and a pulse width of 100 nsec. A continuous beam having an output of 0.5 mW was emitted as a reproducing laser beam. Reflected light of the beam was detected for reproduction. FIG. 5 shows a relationship between the contrast ratio of the reproduced signal and the gas mixture ratio. As shown in FIG. 5, when the mixture ratio of $(CH_4+O_2)/H_2$ falls within a range of 90/10 to 50/50, i.e., when the mixture ratio of $H_2/(CH_4+O_2+H_2)$ falls within a range of 0.1 to 0.5, the contrast ratio of the reproduced signal exceeds that of a recording medium formed at a mixture ratio of $H_2/(CH_4+O_2+H_2)=0$. The contrast ratio of the reproduced signal decreases monotonously as the radiation energy of the recording laser beam increases, as shown in FIG. 4. Therefore, the higher the contrast ratio of a reproduced signal of a recording medium, the higher its threshold value, resulting in a high sensitivity. In other words, addition of $H_2$ contributes to improvement in the sensitivity of a recording film.

EXAMPLE 3

Following the same procedures as in Example 2, except for the gas mixture ratio, a data recording medium having a recording film was manufactured. The gas mixture ratio of $(CH_4+O_2)/H_2$ was constantly 60/40, and that of $CH_4/O_2$ was set at seven values, i.e., 100/0, 95/5, 90/10, 80/20, 70/30, 60/40, 50/50, and 40/60. The gas flow rate of the mixture $(CH_4+O_2)$ was 50 cc/min, and that of $H_2$ was 33 cc/min. Sputtering was performed at a pressure of $5\times10^{-3}$ Torr and at a power of 300 W (13.56 MHz). 5 or 6 films having different thicknesses between 30 and 100 nm were manufactured for every gas mixture ratio. Subsequently, the reflectivity of each data recording medium at a wavelength of 830 nm was measured, and a film thickness at which a maximum reflectivity could be provided was determined for every gas mixture ratio. Although the film thicknesses for providing maximum reflectivities vary depending on the gas mixture ratios, they all fell within a range of 50 to 80 nm.

Figure 6:
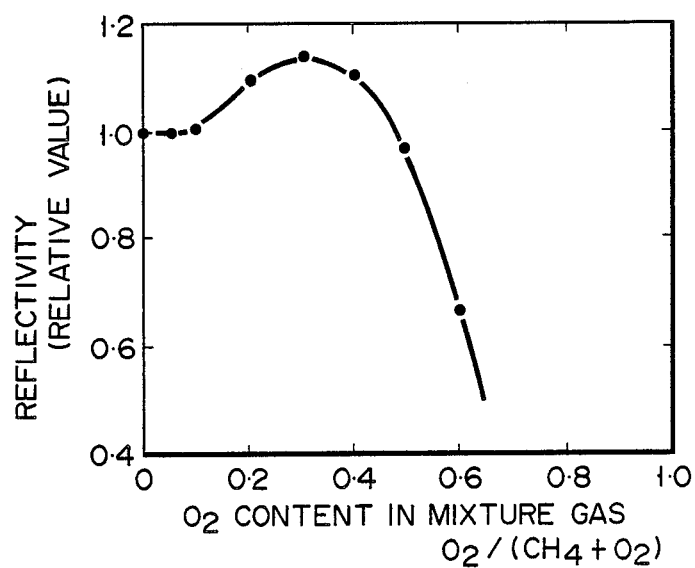

FIG. 6 shows a relationship between a maximum reflectivity and a gas mixture ratio in units of gas mixture ratios. It is apparent from FIG. 6 that when the gas mixture ratio of $CH_4/O_2$ falls within a range of 100/0 to 50/50, i.e., when the gas mixture ratio of $O_2/(CH_4+O_2)$ falls within a range of 0 to 0.5, a high reflectivity of 30% or more can be obtained regardless of the gas mixture ratio. On the other hand, when $O_2/(CH_4+O_2)=0.6$, only a low reflectivity of about 20% which is practically unsatisfactory as a data recording medium could be obtained.

EXAMPLE 4

Following the same procedures as in Example 3 except that the gas mixture ratio of $(CH_4+O_2)/H_2$ was set at 60/40, data recording media were manufactured at different $O_2/(CH_4+O_2)$ ratios. A relationship between a recording film deposition rate and a gas mixture ratio was studied. When $O_2/(CH_4+O_2)=0$, i.e., when $CH_4/H_2=60/40$, the deposition rate was 5 nm/min or less. This value was about ¼ to 1/5 that obtained when $O_2/(CH_4+O_2)=5/95$ to 40/60. Namely, when $O_2$ gas was not added, the deposition rate of a recording film was considerably small. The surface of sputtered In target was observed. When $O_2$ was added at a ratio of $O_2/(CH_4+O_2)=5/95$ or more, the deposition amount on the surface of the target was small. When $O_2/(CH_4+O_2)=0$, however, a black deposit was clearly found on the surface of the target. It was assumed that the deposition rate was decreased because of the black deposit on the target surface when $O_2/(CH_4+O_2)=0$. In other words, this example shows that $O_2/(CH_4+O_2)$ must be 5/95 or more in order to obtain a practically preferable deposition rate of 10 nm/min. This is because a recording medium having a low deposition rate of about 5 nm/min or less is not practically preferable even if it has similar recording characteristics to a high-deposition rate recording medium.

EXAMPLE 5

Following the same procedures as in Example 1, except for the mixture gas ratio, a data recording medium having a recording film was manufactured. The gas mixture ratios of $CH_4/O_2$ and $(CH_4+O_2)/H_2$ were constantly 80/20 and 63/37, respectively, and that of $(CH_4+O_2+H_2)/Ar$ was set at five values, i.e., 100/0, 90/10, 80/20, 73/27, and 67/33. The gas flow rates of $CH_4$, $O_2$, and $H_2$ were constantly 20 cc/min, 5 cc/min, and 15 cc/min, respectively, and that of Ar was set at 5, 10, 15, and 20 cc/min. The film thicknesses were all set at 80 nm by changing the discharge times.

The relationship between the deposition rate of the recording film and the gas mixture ratios in this case was studied. It was found that the deposition rate was monotonously increased as the mixture ratio of Ar was increased. Assuming that the deposition rate obtained with no Ar addition, i.e., $(CH_4+O_2+H_2)/Ar=100/0$, is defined as 1, when Ar was added in an amount of 10%, i.e., $(CH_4+O_2+H_2)/Ar=90/10$, the deposition rate was 1.3, and when Ar was added in an amount of 13%, i.e., $(CH_4+O_2+H_2)/Ar=67/33$, the deposition rate was 1.06.

Data was recorded and reproduced in the same manner as in Example 2 using the thus manufactured data recording media. The relationship between a contrast ratio of a reproduced signal and a gas mixture ratio in this case was studied. When $(CH_4+O_2+H_2)/Ar=90/10$, 80/20, or 73/27, a good contrast ratio was obtained similarly as in a case wherein no Ar was added. When $(CH_4+O_2+H_2)/Ar=67/33$, however, the contrast ratio was abruptly decreased compared to the case wherein no Ar was added.

In the data recording medium obtained by the present invention, data is recorded by forming bubbles and the bubble has a considerably smooth shape and thus provides a good transfer property as a master disk. Therefore, this data recording medium can be used as a compact disk which is a reproduction-only optical disk (CD-ROM), a video disk (VD-ROM), or a master disk for forming a resin substrate (pregrooved substrate) having a tracking guide groove. Examples of disks of these types will be described.

EXAMPLE 6

A recording film having a thickness of 80 nm was formed on a glass substrate having a thickness of 8 mm. The gas mixture ratios were $CH_4/O_2=70/30$ and $(CH_4+O_2)/H_2=60/40$. A recording medium thus manufactured was irradiated with a pulse-modulated laser beam to form bubbles to correspond to a recording signal of a CD-ROM while it is being rotated, thereby preparing a master disk.

An Au film having a thickness of 20 nm was deposited by sputtering on the entire surface of the recording film of the master disk having bubbles, and an Ni plate was formed on the recording film by electroforming using the Au film as an electrode. The Ni plate was removed after electroforming to prepare a molding die called a stamper. The thickness of the stamper was set to be 300 μm. Polycarbonate was injection-molded using the resultant stamper and an Al film was deposited thereon as a reflective film. When an optical disk (CD-ROM) manufactured in this manner was used for reproduction using a GaAlAs laser, a good reproduced signal was obtained. It was thus confirmed that this optical disk could be satisfactorily used as a CD-ROM.

According to this Example, when a bubble-mode optical disk having recording layer 30 constituted by matrix 32 containing indium clusters 34 and organic clusters 36 is formed by plasma sputtering, a target body consisting of a single metal is used. The metal constituting the target body is a low-melting point metal constituting metallic component of indium oxide matrix 32 and clusters 34 contained in layer 30, and indium in this Example. Other components containing organic materials required for forming a recording layer (30) are introduced in a gaseous phase into vacuum chamber 10. More specifically, gases having a plurality of components of methane series hydrocarbon, oxygen, and hydrogen (and argon as needed) are introduced into chamber 10. When sputtering is performed, the following processes are simultaneously carried out: the oxidation of indium, the sputtering indium and indium oxide, and synthesis of organic clusters due to plasma polymerization in chamber 10, and indium oxide matrix 32, in which indium clusters 34 and organic clusters 36 of an organic compound are uniformly dispersed, is formed on substrate 22. Thus, recording layer 30 can be formed by single plasma sputtering. Hence, the manufacturing yield of bubble-mode optical disks can be increased to facilitate mass-production.

Since the components required for constituting organic clusters 36 in the recording layer are supplied in gaseous phases, the size of the clusters of the organic compound dispersed in matrix 32 can be reduced. Thus, the size of organic clusters 36 can be reduced, providing an ideally uniform distribution of organic clusters 36 in matrix 32. As a result, the basic properties of the bubble-mode optical disk can be improved.

The characteristics of recording layer 30 having the above structure depend strongly upon the target material and the sputtering gas actually used. When the characteristics of recording layer 30 is to be changed, only the mixture ratios of the sputtering as in chamber 10 must be changed, and the composition of the target body need not be changed. The mixture ratios of the plurality of gases can be changed quite easily (by adjusting the supply rates (supply amounts per unit time) of the respective gas components from a gas container) than changing the composition of the target body. Thus, even when different optical disks having recording layers of different compositions are to be manufactured, a basic manufacturing process need not be altered and a target body can be used in common. This is important since it enables optical disk manufacturers to manufacture different optical disks having recording layers of different compositions easily and efficiently. The above-described feature can make it unnecessary for disk manufacturers to prepare an alloy target, of which manufacturing is very difficult, or to use a specific sputtering apparatus with a multi-target which is high in cost.

Since hydrogen gas is simultaneously introduced in chamber 10 together with other gases, the amounts of metal (indium) components contained in recording layer 30 can be increased. This improves the light absorption amount to increase the gas amount (evaporation amount of the organic material) produced by organic clusters 36 when a laser beam of the same light intensity level is radiated. Therefore, the degree of local deformation within matrix 32 can be improved, leading to an improvement in sensitivity of the bubble-mode optical disk.

The gas mixture introduced into chamber 10 during sputtering may be set to contain methane series hydrocarbon, oxygen, and nitrogen. When methane gas is selected as the methane series hydrocarbon, it is preferable that the volume ratio ($CH_4/O_2$) of the methane gas to oxygen gas is set to fall within a range of 95/5 to 50/50, and that the volume ratio (($CH_4+O_2$)/$N_2$) of the sum of the methane gas and the oxygen gas to the nitrogen gas is set to fall within a range of 95/5 to 70/30. In this case wherein nitrogen is contained, it is very important to also add argon gas in the gas mixture. It is preferable that the volume ratio of argon to the gas mixture, $Ar/(Ar+CH_4+O_2+N_2)$, is not larger than 0.3. (Detailed discussion will be given with respect to Example 11 presented below.)

With this manufacturing process, a recording layer having a basic structure as shown in FIG. 2 can also be formed on the substrate, while providing the similar effect to the above case. Particularly, since the gas mixture introduced into chamber 10 contains nitrogen, indium clusters 34, organic clusters 36 and the matrix of a recording layer of a bubble-mode optical disk which is formed in this method are locally nitrogenized. Therefore, the oxidation resistance of the recording layer can be improved, thereby improving reliability, particularly product life, of a bubble-mode optical disk.

Several examples of the manufacturing method of the present invention using a gas mixture containing nitrogen gas, which were conducted by the present inventors, will be described.

EXAMPLE 7

A recording film was formed using a sputtering unit having an In target of 8-inch diameter. A 1.5 mm-thick polymethyl methacrylate substrate was used as the substrate. The sputtering gas was a gas mixture of methane, oxygen, and nitrogen mixed at volume ratios of $CH_4/O_2=70/30$ and $(CH_4+O_2)/N_2=91/9$. The gas flow rates of $CH_4$, $O_2$, and $N_2$ were 21 cc/min, 9 cc/min, and 3 cc/min, respectively. Sputtering was performed by discharge at a pressure of $5\times10^{-3}$ Torr and a power of 300 W (13.56 MHz) for about 3 minutes, thereby depositing a recording film having a thickness of 70 nm on substrate 22.

Subsequently, the thus-obtained data recording medium was rotated at a frequency of 600 rpm. Recording was performed by irradiating the surface of substrate 22 with a GaAlAs laser beam, as a recording laser beam, which was focused to have a spot size of 1.5 $\mu$m and having an output of 10 mW and a pulse width of 100 nsec. Then, a continuous laser beam having an output of 0.5 mW was emitted as a reproducing laser beam, and reflected light was detected to perform reproduction. A reproduced output signal had a good CNR of 50 dB.

When the surface of the recording film of the recorded data recording medium was observed by a scanning electron microscope, bubbles of good shapes with smooth surface each having bottom diameter of about 2 $\mu$m were formed in the spots irradiated with the recording laser beam. The recorded medium was kept under the condition of 70° C. and 85% RH for 20 days. Then, the surface of the recording film of the data recording medium was observed by the scanning electron microscope. No striking change was found either in the bubbles or in the non-irradiated flat region. It was thus confirmed that the data recording medium manufactured in accordance with the present invention stably maintained good characteristics over a long period of time.

EXAMPLE 8

Following the same procedures as in Example 7, except for the gas mixture ratio, data recording media having recording films were manufactured. The gas mixture ratio of $CH_4/O_2$ was constantly 70/30, and that of $(CH_4+O_2)/N_2$ was set at six values, i.e., 100/0, 94/6, 91/9, 83/17, 71/29, and 63/37. The gas flow rates of $CH_4$ and $O_2$ were 21 cc/min and 9 cc/min and that for $N_2$ was 2, 3, 6, 12, and 18 cc/min, respectively. The film thicknesses were set at 70 nm by changing the discharge times.

Figure 7:
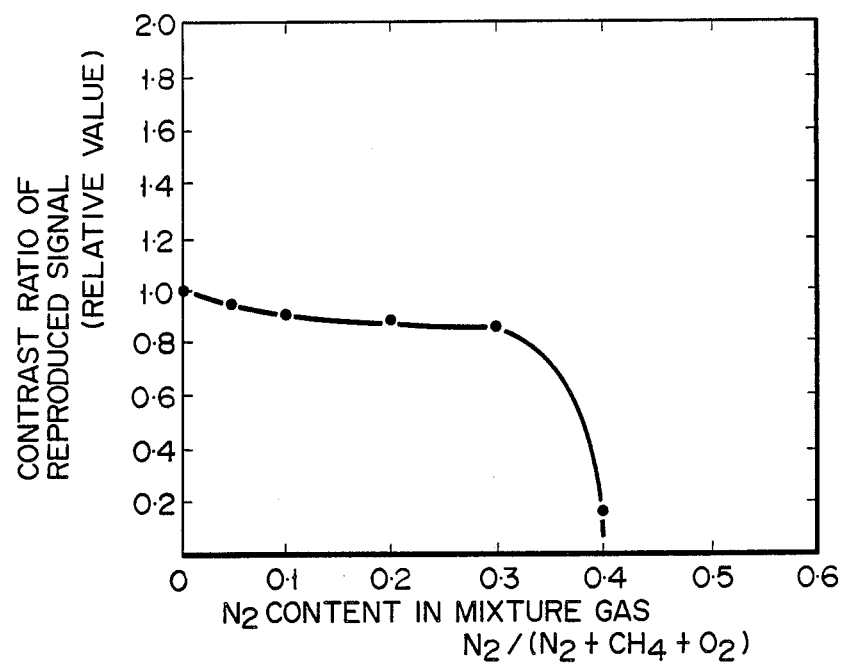

Subsequently, each data recording medium thus obtained was rotated at a frequency of 600 rpm. Recording was performed by irradiating the surface of the substrate with a GaAlAs laser beam, as a recording laser beam, which was focused to have a spot size of 1.5 $\mu$m, an output of 10 mW, and a pulse width of 100 nsec. A continuous beam having an output of 0.5 mW was emitted as a reproducing laser beam. Reflected light of the beam was detected for reproduction. FIG. 7 shows a contrast ratio of the reproduced signal in this case. As shown in FIG. 7, when the mixture ratio of $N_2/(CH_4+O_2+N_2)$ exceeds 0.3 and reaches 0.4, the contrast ratio of the reproduced signal is decreased (recording sensitivity is decreased). When $N_2/(CH_4+O_2+N_2)$ is 0 to 0.3, the contrast ratio remains almost the same.

Figure 8:
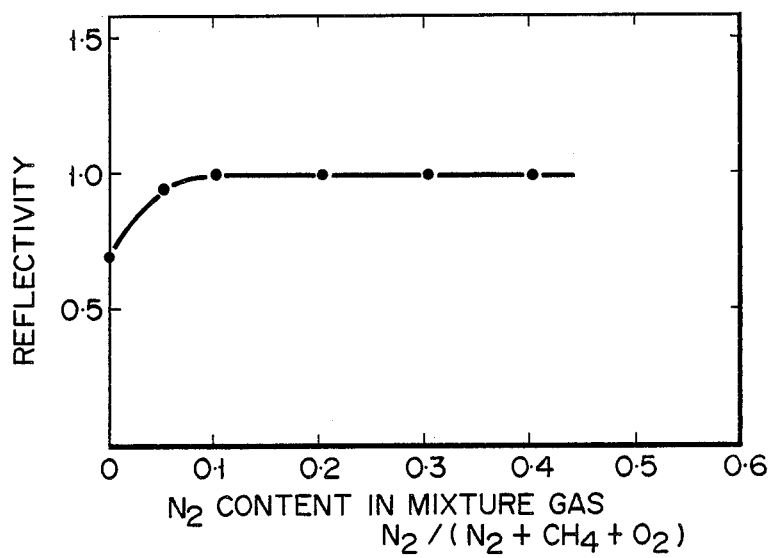

The obtained data recording media were kept under the condition of 70° C. and 85% RH for 20 days. FIG. 8 shows values (R/Ro) obtained by standardizing reflectivity R (having wavelength 633 nm) of the data recording medium after the above treatment by reflectivity Ro before the above treatment. It was found that the reflectivity does not substantially vary, that is, the oxidation resistance is improved when $N_2/(CH_4+O_2+N_2)$ was 0.05 or more. Note that the change in reflectivity is large when $N_2/(CH_4+O_2+N_2)=0$ because the In clusters dispersed in the $In_2O_3$ matrix are oxidized during the above treatment in the thermo-hygrostat, resulting in a low reflectivity.

EXAMPLE 9

Following the same procedures as in Example 8, except for the gas mixture ratio, a data recording medium having recording films were manufactured. The gas mixture ratio of $(CH_4+O_2)/N_2$ was constantly 83/17, and that of $CH_4/O_2$ was set at eight values, i.e., 100/0, 95/5, 90/10, 80/20, 70/30, 60/40, 50/50, and 40/60. The gas flow rate of the mixture of $(CH_4+O_2)$ was 50 cc/min, and that of $N_2$ was 10 cc/min. Sputtering was performed at a pressure of $5\times10^{-3}$ Torr and at a power of 300 W (13.56 MHz). 5 or 6 films having different thicknesses between 30 and 100 nm and different discharge times, i.e., different film thicknesses, were manufactured for every gas mixture ratio. Subsequently, the reflectivity of each data recording medium at a wavelength of 830 nm was measured, and a film thickness at which a maximum reflectivity could be provided was determined for every gas mixture ratio. Although the film thicknesses for providing maximum reflectivities vary depending on the gas mixture ratios, they all fell within a range of 50 to 80 nm.

Figure 9:
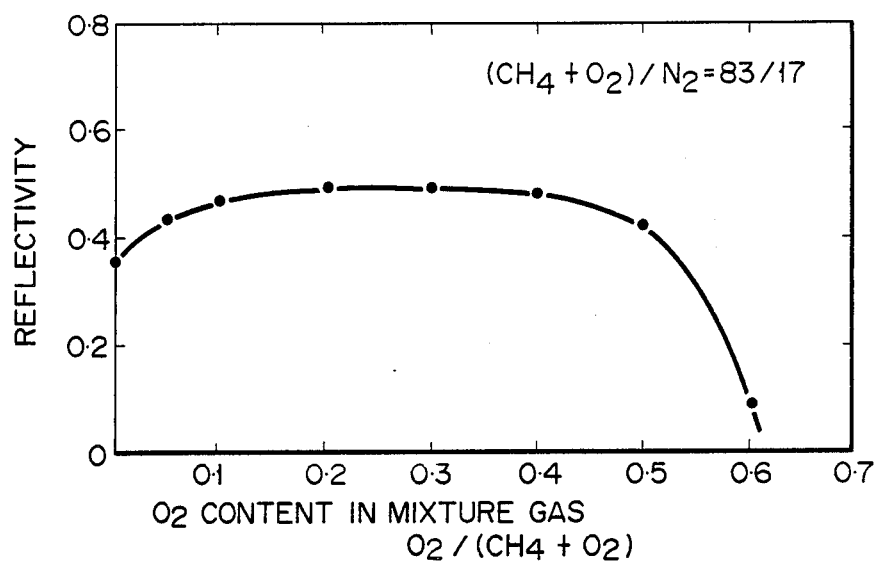

FIG. 9 shows a relationship between a maximum reflectivity and a gas mixture ratio in units of gas mixture ratios. It is apparent from FIG. 7 that when the gas mixture ratio of $CH_4/O_2$ falls within a range up to 50/50, a high reflectivity of 30 to 50% can be obtained regardless of the gas mixture ratio. On the other hand, when $O_2/(CH_4+O_2)=40/60$, only a low reflectivity of 8% which is practically unsatisfactory as a data recording medium could be obtained.

EXAMPLE 10

Following the same procedures as in Example 9 except that the gas mixture ratio of $(CH_4+O_2)/N_2$ was set at 83/17, data recording media having a different $O_2/(CH_4+O_2)$ mixture ratio were manufactured. A relationship between a recording film deposition rate and a gas mixture ratio was studied. When $O_2/(CH_4+O_2)=0$, i.e., when $CH_4/N_2=83/17$, the deposition rate was 5 nm/min or less. When $O_2/(CH_4+O_2)=5/100$ to 60/40, the deposition rate was 30 to 50 nm/min. Namely, when $O_2$ gas was not added, the deposition rate of a recording film was considerably small. The surface of a sputtered In target was observed after the sputtering. When $O_2$ was added at a ratio of $O_2/(CH_4+O_2)=5/95$ or more, the deposition amount on the surface of the target was small. When $O_2/(CH_4+O_2)=0$, however, a black deposit was found on the surface of the target. Thus, it was assumed that the deposition rate was decreased when $O_2/(CH_4+O_2)=0$ because of the black deposit. In other words, this example shows that $O_2/(CH_4+O_2)$ must be 5/95 or more in order to obtain a practically preferable deposition rate of 10 nm/min. This is because a recording medium having a low deposition rate of about 5 nm/min or less is not practically preferable even if it has similar recording characteristics to a high-deposition rate recording medium.

EXAMPLE 11

Following the same procedures as in Example 7, except for the mixture gas ratio, data recording media having recording films were manufactured. The gas mixture ratios of $CH_4/O_2$ and $(CH_4+O_2)/N_2$ were constantly 70/30 and 91/9, respectively, and that of $(CH_4+O_2+N_2)/Ar$ was set at five values, i.e., 100/0, 87/13, 77/23, 69/31, and 62/38. The gas flow rates of $CH_4$, $O_2$, and $N_2$ were constantly 21 cc/min, 9 cc/min, and 3 cc/min, respectively, and that of Ar was set at 5, 10, 15, and 20 cc/min. The film thicknesses were all set at 70 nm by changing the discharge times.

Figure 10:
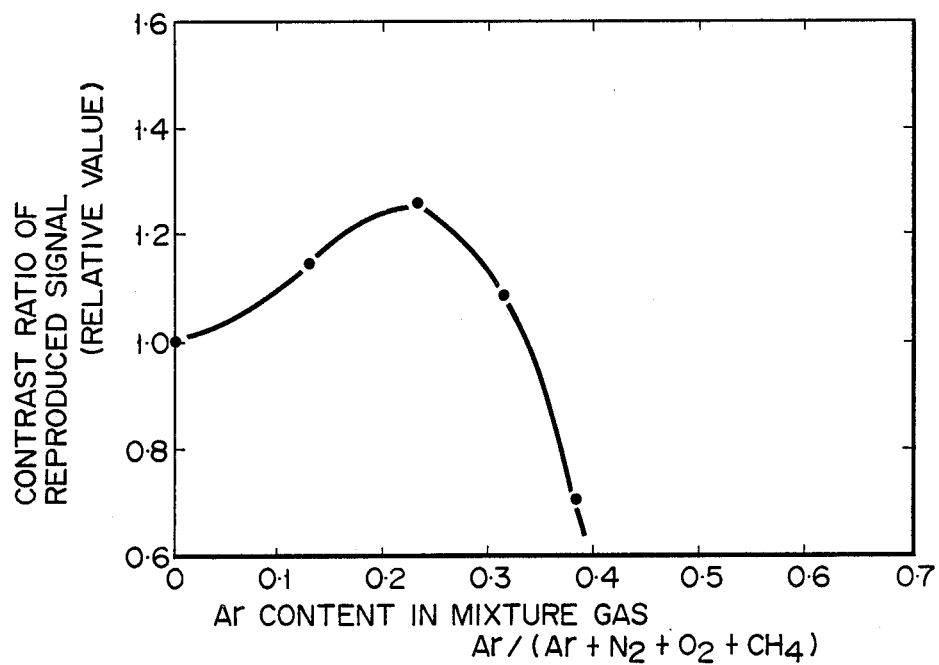

Data was recorded and reproduced in the same manner as in Example 8 using the thus manufactured data recording media. FIG. 10 shows a relationship between a contrast ratio of a reproduced signal and a gas mixture ratio in this case. The contrast ratio is shown by a relative value assuming that the value obtained when no Ar is added is 1. It is found that the contrast ratio was improved when $Ar/(Ar+CH_4+O_2+N_2)=0.3$ or less. When $Ar/(Ar+CH_4+O_2+N_2)$ exceeds 0.3, however, the contrast ratio was abruptly decreased.

Although the invention has been described with reference to a specific embodiment, it shall be understood by those skilled in the art that numerous modifications may be made that are within the spirit and scope of the inventive contribution.

What is claimed is:

1. A method for manufacturing an optical recording medium having a recording layer comprising a mixture of a refractory matrix containing metal clusters and organic clusters, said metal clusters absorbing an energy of beam radiation incident onto said recording layer to heat said organic clusters which release a gas component such that said matrix deforms to form a protuberance, said method comprising the steps of:

arranging a substrate and a target body consisting of indium in a chamber to be opposite to each other, said indium target body substantially consisting of the metal for constituting said metal clusters; and forming, within said chamber, a low-pressure gaseous atmosphere comprising a methane series hydrocarbon, hydrogen and oxygen which are used to constitute said organic clusters and said matrix, thus performing plasma sputtering, wherein organic materials required to form said recording layer are introduced in gaseous phase into said chamber, and wherein a volume ratio of the methane series hydrocarbon to oxygen in the low-pressure gaseous atmosphere is set to be 95/5 to 50/50, and a volume ratio of the sum of the methane series hydrocarbon and hydrogen to oxygen is set to be 90/10 to 50/50, whereby said recording layer is deposited on said substrate and has decreased size of organic clusters, thereby improving uniformity in distribution of said organic clusters in said matrix.

2. The method according to claim 1, wherein methane is selected as the methane series hydrocarbon.

3. The method according to claim 1, wherein the low-pressure gaseous atmosphere further contains a rare gas.

4. The method according to claim 3, wherein a volume ratio of the sum of the methane series hydrocarbon, oxygen, and hydrogen to the rare gas in the low-pressure gaseous atmosphere is set at not less than 70/30.

5. The method according to claim 4, wherein the rare gas contains argon.

6. A method for manufacturing an optical recording medium having a recording layer comprising a mixture of a refractory matrix containing metal clusters and organic clusters, said metal clusters absorbing an energy of beam radiation incident onto said recording layer to heat said organic clusters which release a gas component such that said matrix deforms to form a protuberance, said method comprising the steps of:

arranging a substrate and a target body consisting of indium in a chamber to be opposite to each other, said indium target body substantially consisting of the metal for constituting said metal clusters; and forming, within said chamber, a low-pressure gaseous atmosphere comprising a methane series hydrocarbon, nitrogen and oxygen which are used to constitute said organic clusters and said matrix, thus performing plasma sputtering, wherein organic materials required to form said recording layer are introduced in gaseous phase into said chamber, and wherein a volume ratio of the methane series hydrocarbon to oxygen in the low-pressure gaseous atmosphere is set to be 95/5 to 50/50, and a volume ratio of the sum of the methane series hydrocarbon and oxygen to nitrogen is set to be 95/5 to 70/30, whereby said recording layer is deposited on said substrate and has decreased size of organic clusters, thereby improving uniformity in distribution of said organic clusters in said matrix.

7. The method according to claim 6, wherein methane is selected as the methane series hydrocarbon.

8. The method according to claim 6, wherein the low-pressure gaseous atmosphere further contains a rare gas.

9. The method according to claim 8, wherein a ratio by volume of the sum of the methane series hydrocarbon, oxygen, and hydrogen to the rare gas in the low-pressure gaseous atmosphere is set at not less than 70/30.

10. The method according to claim 9, wherein the rare gas contains argon.

11. The method according to claim 10, wherein a volume ratio of the argon to the sum of the argon, the methane series hydrocarbon, the oxygen and the nitrogen is set to be less than 3/10.

* * * * *